(12) United States Patent
Shaler et al.

(10) Patent No.: US 6,320,750 B2
(45) Date of Patent: *Nov. 20, 2001

(54) SUB-MODULAR CONFIGURABLE AVIONICS

(75) Inventors: Barton G. Shaler, Solana Beach; Donald A. Porter, San Diego; Milton F. Damerow, Poway, all of CA (US)

(73) Assignee: TRW Inc., Redondo Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,755

(22) Filed: Nov. 24, 1998

(51) Int. Cl.[7] ....................................................... H05K 1/18
(52) U.S. Cl. .......................... 361/736; 361/748; 361/749; 361/760; 361/785; 361/788; 439/67; 439/77; 174/250; 174/254; 174/255
(58) Field of Search ..................................... 361/736, 749, 361/760, 785, 788, 796, 807, 748; 439/67, 77, 493; 174/250, 254, 255

(56) References Cited

U.S. PATENT DOCUMENTS

| | | | |
|---|---|---|---|
| 4,902,236 | * | 2/1990 | Hasircogly ............................. 439/77 |
| 4,947,288 | * | 8/1990 | Olsson et al. ......................... 361/788 |
| 5,006,961 | * | 4/1991 | Monico ................................. 361/788 |
| 5,023,754 | * | 6/1991 | Aug et al. ............................. 361/800 |
| 5,276,590 | * | 1/1994 | Budman et al. ...................... 361/796 |
| 5,495,397 | * | 2/1996 | Davidson et al. .................... 361/784 |
| 5,509,066 | * | 4/1996 | Saligny ................................. 379/327 |
| 5,652,697 | * | 7/1997 | Le ......................................... 361/788 |

* cited by examiner

Primary Examiner—Leo P. Picard
Assistant Examiner—David Foster
(74) Attorney, Agent, or Firm—Katten Muchin Zavis

(57) ABSTRACT

A line replaceable module (LRM) configured with a plurality of mini-modules, each of which have relatively higher contact densities than currently available LRMs with the same form factor, for example, a Standard Electrical Module-Size E (SEM-E) form factor. The mini-modules are significantly less expensive than an entire module allowing such mini-modules to be disposable, eliminating relatively costly fault diagnostics and repair. Each mini-module includes a printed circuit board which includes a rigid primary portion, a rigid secondary portion and flexible portion interconnecting the primary and secondary portions. The rigid secondary portion may be configured to provide dual-sided interconnection to a backplane data bus. Use of the dual-sided rigid secondary portion provides for generous spacing for contact densities much higher than known contact densities for LRMs with the same form factor. The rigid primary portion carries the components forming the LRM. The use of the flexible portion provides compensation for tolerance variations as well as vibrational and thermal stress relative to connector systems used on known SEM-E LRMs.

12 Claims, 6 Drawing Sheets

SUB-MODULAR CONFIGURABLE AVIONICS

BACKGROUND OF THE INVENTION

1. Field of the Invention

The present invention relates to a line replaceable module LRM for a digital avionics system, and more particularly to a modular LRM configured from self-contained mini-boards, for example, two to four mini-boards, with increased functionality adapted to interface with the digital avionics system by way of a high contact density backplane connector.

2. Description of the Prior Art

Avionic control systems aboard aircraft are implemented by way of modules that are adapted to be connected to the aircraft data bus. Such modules are known as line replaceable modules (LRM). For example, the Boeing B-777 Airplane Information Management System (AIMS) utilizes a total of eleven LRMs connected to common chassis. Due to the limited space available on aircraft, generally only one or two chassis' are permitted per aircraft. Each chassis may include two power LRMs, each connected to different power buses; four I/O LRMs; three central processing modules (CPM) LRMs; an autothrottle LRM; and a communication LRM. The various LRMs within the chassis are used for various functions, including flight management, electronic flight instrument systems, engine indicating and crew alerting system display management.

Various bus architectures are known for interconnecting the LRMs. In civil aircraft, the LRMs within each chassis are known to be connected to what is known as an ARINC 659 backplane data bus, which operates at about 30 MBIT/S over either a twisted wire pair or fiberoptic cables.

Due to the limited space aboard an aircraft, the form factor of such LRMs is specified by various standards. For example, a MIL-STD-28787 standard describes a number of standard configurations and sizes for electronic modules, including LRMs. The aforementioned standard specifies a Standard Electronic Module-Size E (SEM-E) form factor for an LRM defined as a module 5.88" high and 6.4" deep. The width of the SEM-E module can vary in 0.1" increments from about 0.28" to 0.58". The dimensional constraints of the SEM-E LRM limits contact density to about 400 or less. Unfortunately, with the ever increasing complexity of avionics, higher contact densities are required.

Known LRMs include two to four printed circuit boards (PCB) for example, up to a maximum size of 5"×5" for carrying various components to perform the specified function as discussed above. Each PCB is formed with an edge connector along one edge for electrically interfacing the PCB to a backplane data bus within the LRM chassis. In applications where contact densities of more than 400 are required, one known approach is to provide interconnections between the PCBs, as well as reduced spacing between contacts. As such, known LRM's which must meet the SEM-E form factor utilize flexible connectors and/or cross-overs to provide interfaces between the PCBs. Due to the different contact lengths and close spacing required in such applications, electrical performance is known to be degraded in such applications as a result of the impedance variability and cross-talk between contacts.

There are other problems associated with known LRMs. For example, fault detection and fault isolation capabilities are required down to the component level. As such, in applications where increased contact densities are required, the fault detection and fault isolation requirements result in relatively complex boards increasing the cost and complicating the maintenance of such boards. Moreover, known SEM-E modules are designed and fabricated by single suppliers with virtually no integration capability between suppliers. In addition, the current costs of such modules is in the range of $15,000–$20,000. Due to such a high cost, such modules are not disposable and are known to result in relatively expensive fault diagnostics and repair when problems are detected. Thus, there is a need for reduced cost modular LRM which enables defective modules to be discarded and which enables all PCBs in the module to interface by way of the backplane database rather than the interboard connectors.

SUMMARY OF THE INVENTION

Briefly, the present invention relates to a line replaceable module (LRM) configured with a plurality of mini-modules, each of which have relatively higher contact densities than currently available LRMs with the same form factor, for example, a Standard Electrical Module-Size E (SEM-E) form factor. The mini-modules are significantly less expensive than an entire module allowing such mini-modules to be disposable, eliminating relatively costly fault diagnostics and repair. Each mini-module includes a printed circuit board which includes a rigid primary portion, a rigid secondary portion and flexible portion interconnecting the primary and secondary portions. The rigid secondary portion may be configured to provide dual-sided interconnection to a backplane data bus. Use of the dual-sided rigid secondary portion provides for generous spacing for contact densities much higher than known contact densities for LRMs with the same form factor. The rigid primary portion carries the components forming the LRM. The use of the flexible portion provides compensation for tolerance variations as well as vibrational and thermal stress relative to connector systems used on known SEM-E LRMs.

BRIEF DESCRIPTION OF THE DRAWING

These and other objects of the present invention will be readily understood with reference to the following specification and attached drawing, wherein.

DETAILED DESCRIPTION OF THE INVENTION

The present invention relates to a line replaceable module (LRM) formed from a plurality of mini-modules for use in avionic control systems. The LRM in accordance with the present invention provides for relatively higher contact density and thus increased functionality than LRMs with the same form factor without the need for inter-board connectors. The LRM in accordance with the present invention is adapted to be used as a Standard Electrical Module-Size E (SEM-E) as set forth in Military Specification MIL-STD-28787 in which, the configuration, as well as the size, of such modules used in such avionic systems is known to be specified.

The use of mini-modules in the LRM in accordance with the present invention provides several advantages over known LRMs. First, the cost of the mini-modules is significantly less than an entire LRM, thus allowing such mini-modules to be classified as disposable which eliminates costly fault diagnostics and repair. Secondly, the mini-modules are provided with relatively high-density connectors, allowing the mini-modules to be self-contained and independent. As such, each mini-module is connected to the backplane data bus, thus providing isolation between mini-modules. Moreover, since the mini-modules are isolated and communicate through the backplane, mini-modules from various suppliers can be integrated and no other interboard connections are required.

Figure 1:
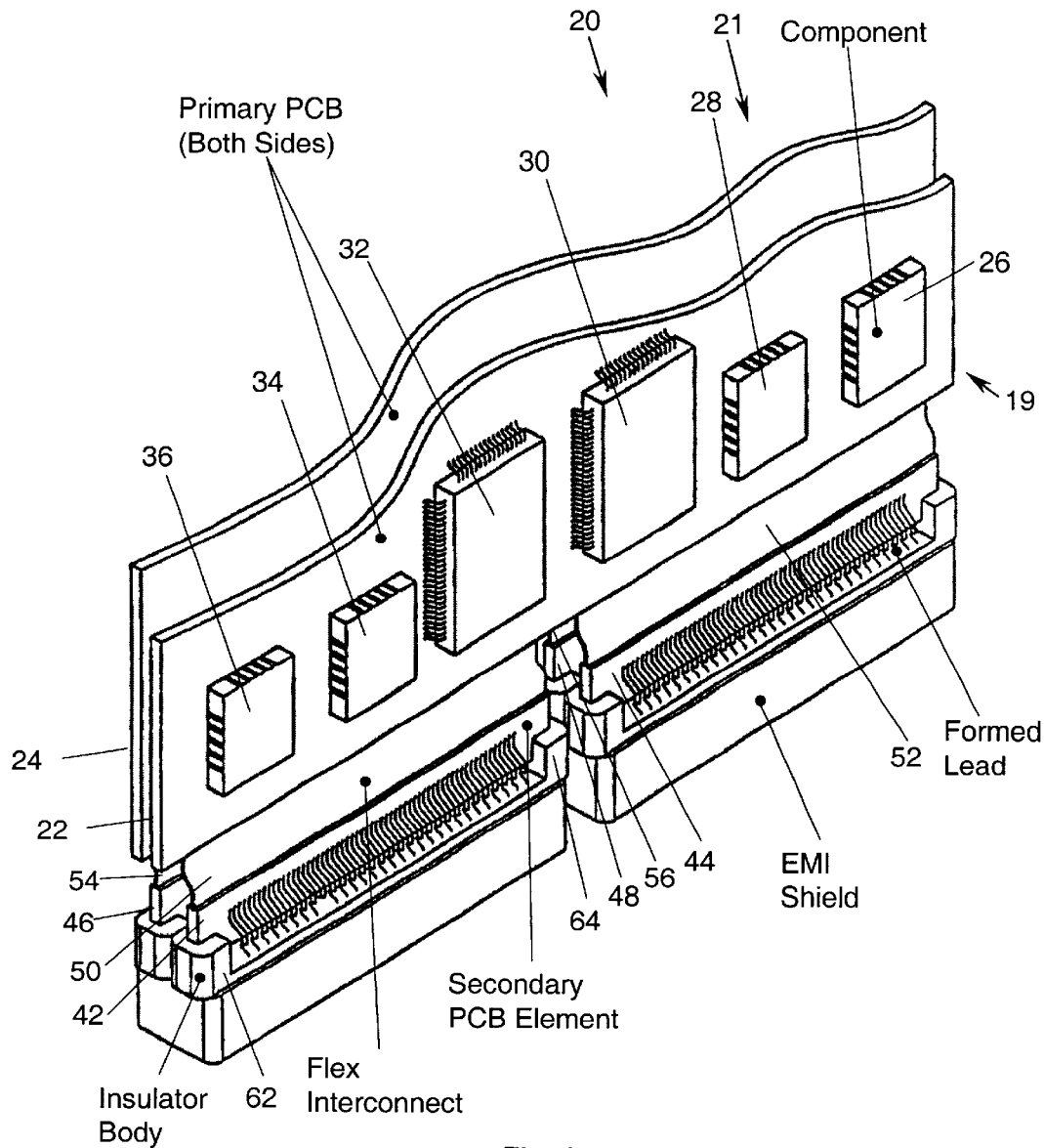
FIG. 1 is a perspective view of an LRM in accordance with one embodiment of the present invention shown with the chassis and cover removed for clarity.
Figure 2:
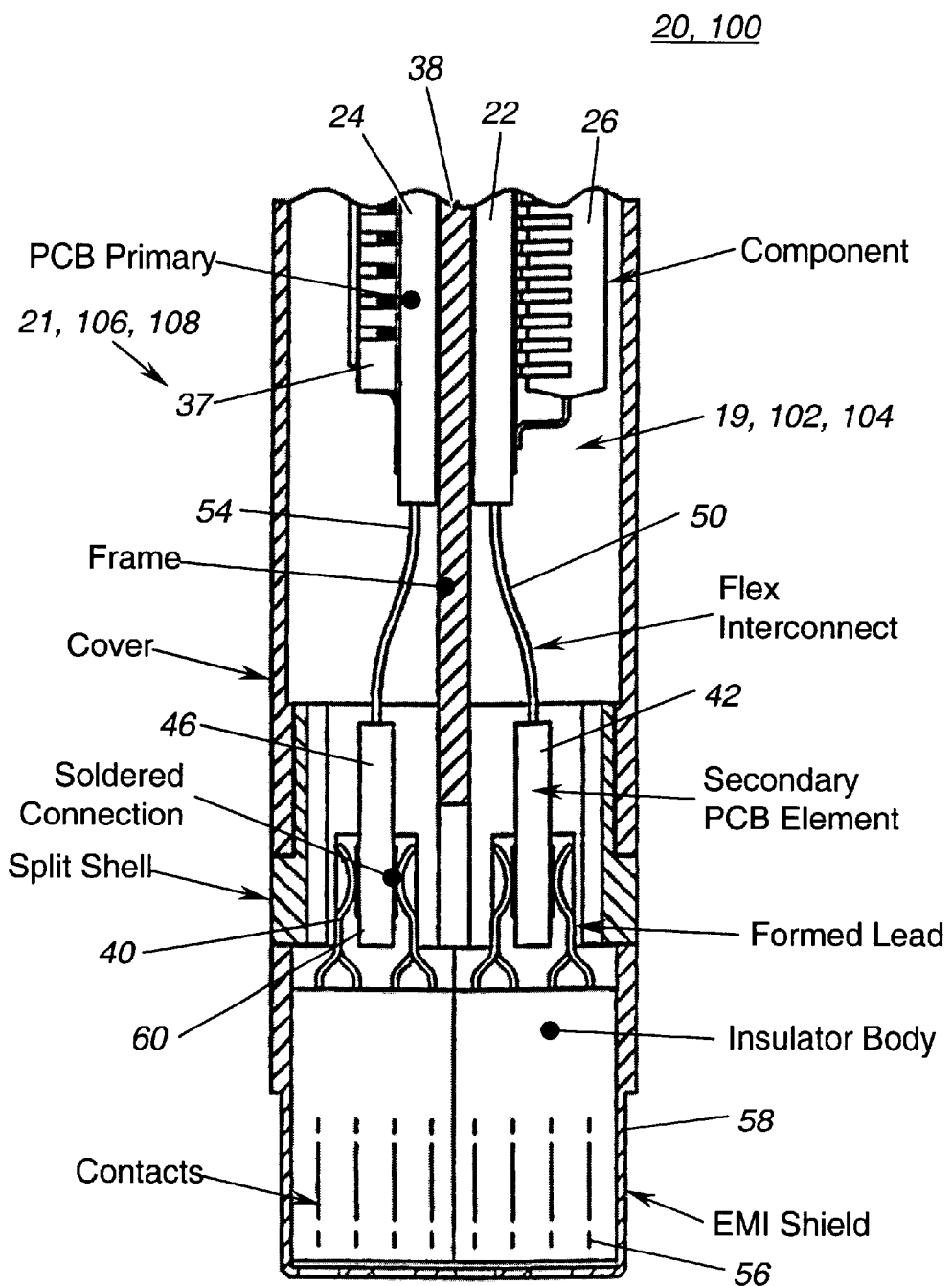
FIG. 2 is a sectional view of the LRM in accordance with the present invention shown connected to backplane contacts forming an aircraft data bus within an LRM chassis.
Figure 3:
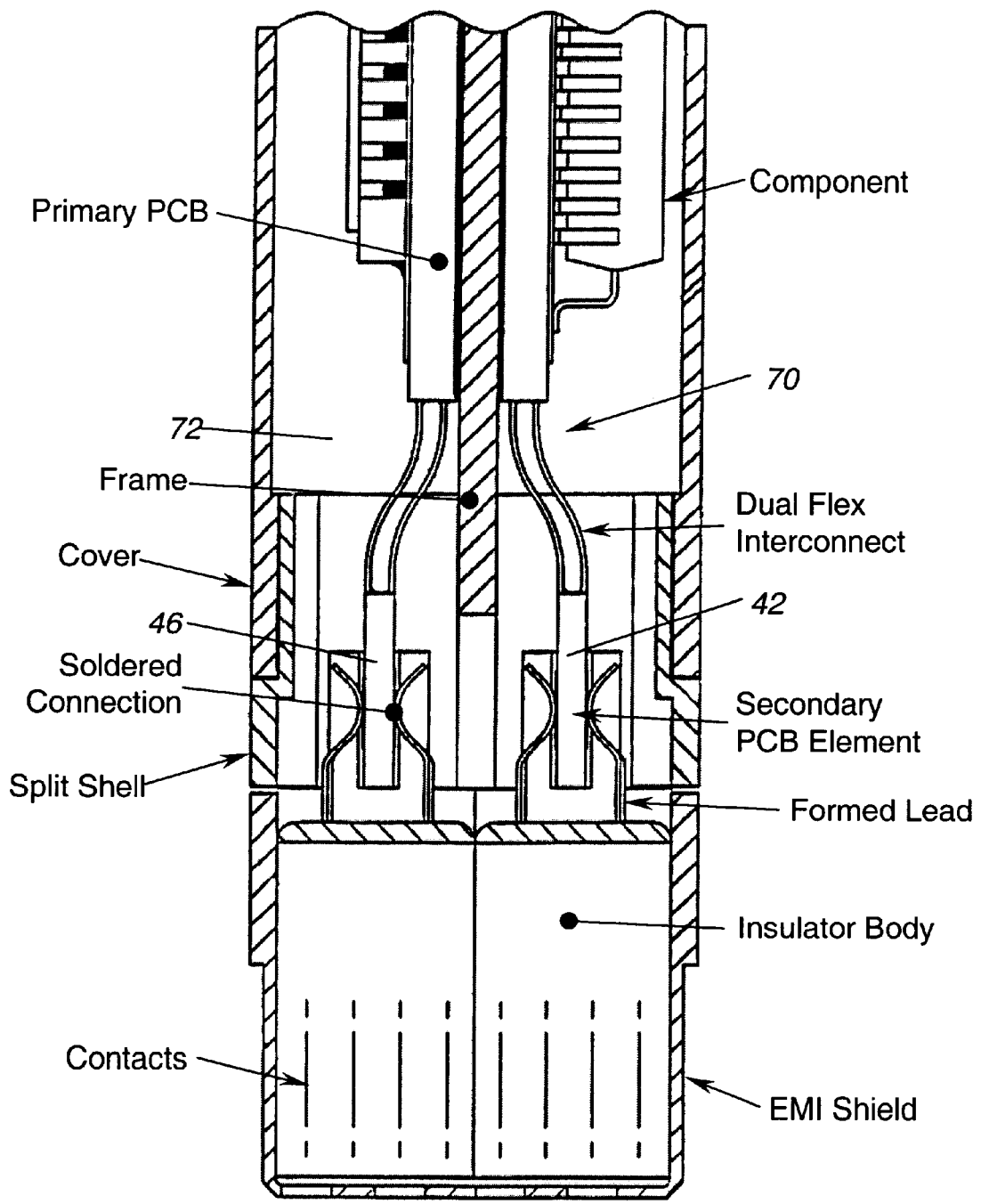
FIG. 3 is a sectional view of an alternate embodiment of the LRM illustrated in FIG. 2.
Figure 4:
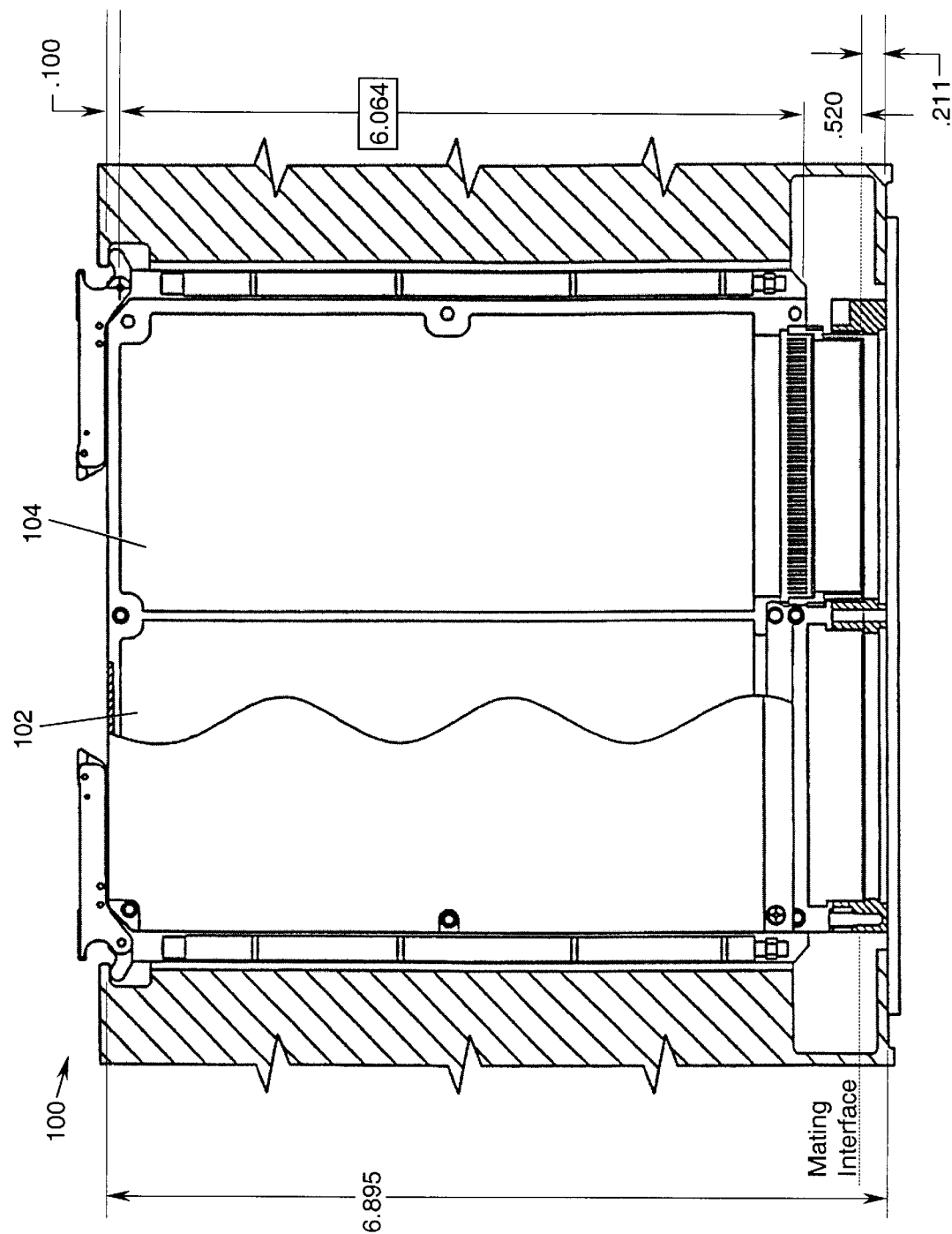
FIG. 4 is an elevational view of an alternate embodiment of the LRM in accordance with the present invention with four mini-modules shown connected to the backplane and partially cut away to illustrate the mini-modules.
Figure 5:
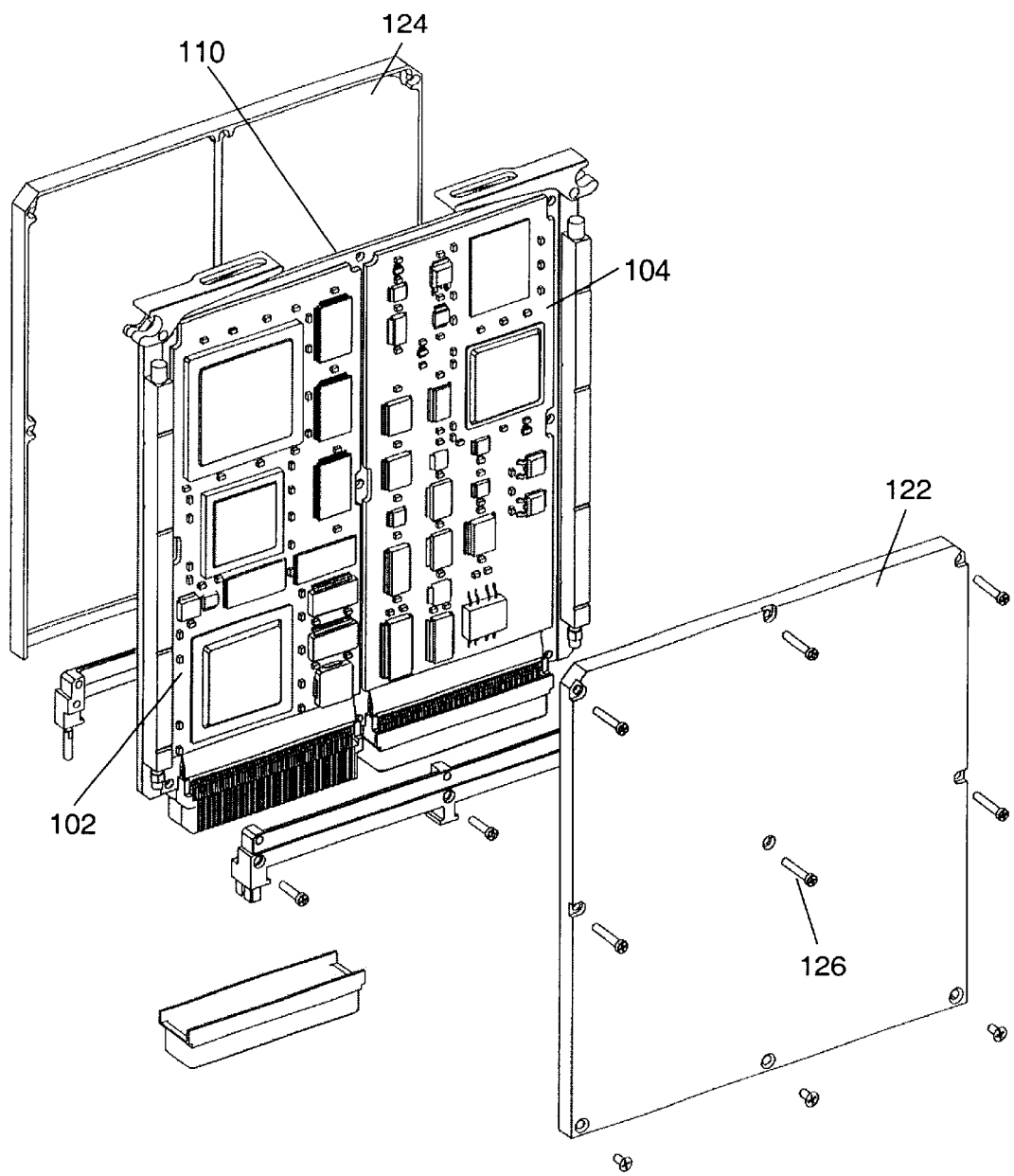
FIG. 5 is an exploded perspective view of the LRM illustrated in FIG. 4.
Figure 6:
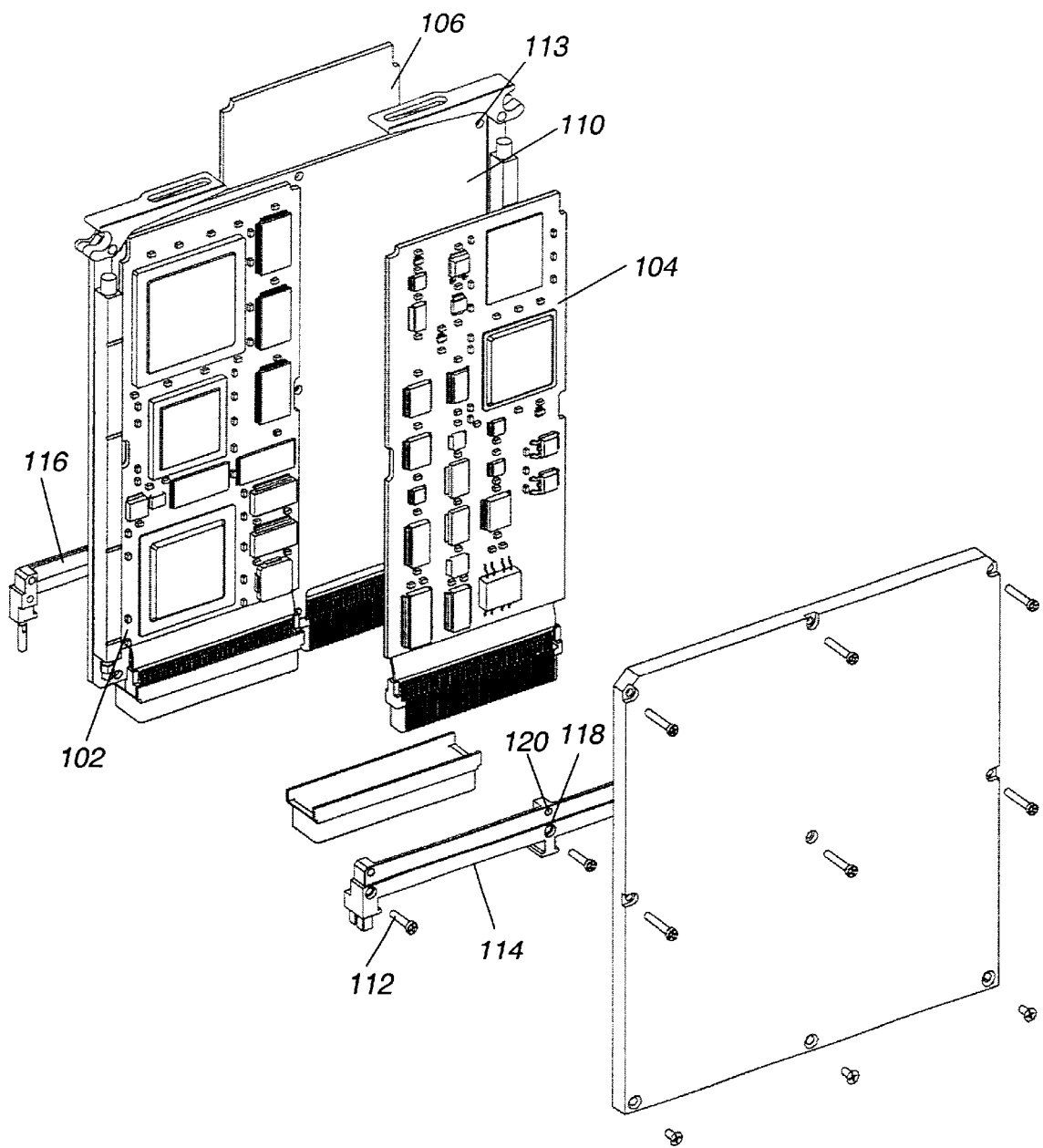
FIG. 6 is a perspective view of the LRM illustrated in FIG. 5, shown with two mini-modules disconnected.

Both half and quarter mini-module embodiments of the invention are disclosed. FIG. 1 illustrates an LRM configured with two mini-modules. FIGS. 4, 5, and 6 illustrate an alternate embodiment configured with four mini-modules. FIGS. 2 and 3 illustrate different embodiments of the mini-modules.

Referring to FIG. 1, LRM in accordance with the present invention is generally referred to with the reference numeral 20. However, as will be understood by those of ordinary skill in the art, the connector system in accordance with the present invention LRM 20 can be used for various purposes other than in connection with LRMs. The LRM 20 includes a pair of mini-modules 19, 21; each mini-module 19, 21 including a rigid primary portion, a rigid secondary portion and a flexible portion interconnecting the rigid primary portion and the rigid secondary portion. The mini-modules 19 and 21 carry various components 26, 28, 30, 32, 34 and 36 in order to perform the intended avionics function of the LRM 20, as discussed above. The particular function of the LRM 20 is outside the scope of the present invention. However, a number of SEM-E LRMs are known, including an MIL-STD-1750A processor, volatile and non-volatile bulk memories, a MIL-STD-1553B bus interface processor, as well as a DC-DC converter. Other types of SEM-E LRMs are also known and described in the above military specification which specifies and functions as well as the pin assignments for each type SEM-E LRM.

The various components 26–36 on the rigid primary portions 22–24 are connected to a data bus, for example, an ARINC 659 data bus as discussed below. The ARINC 659 data bus is a backplane connected data bus., The ARINC 659 data bus may be configured as a serial, two-wire data bus used for interconnecting all of the LRMs within a single LRM chassis (not shown).

Each of the rigid primary portions 22 and 24, as best illustrated in FIG. 2, are adapted to carry various components forming the LRM. As shown best in FIG. 2, the component side of each of the rigid primary portions 22 and 24 face outwardly. The spacing between the rigid primary portions 22 and 24 and the configuration with the component sides facing outwardly enables a frame member 38, forming a part of the chassis (not shown), to be sandwiched between the two rigid primary portions 22 and 24. The frame member 38 may be formed as a heat sink to passively conduct heat generated by the various components 26–36 on the rigid primary portions 22 and 24 away from the LRM 20 to reduce the overall operating temperature of the LRM 20.

An important aspect of the invention is the connection between the rigid primary portions 22 and 24 and the backplane contacts 40 (FIG. 2) forming the data bus. More particularly, referring to FIG. 1, each rigid primary portion 22, 24 is interconnected to a pair of rigid secondary portions 42, 44, 46, 48 configured to be generally parallel to the rigid primary portions 22 and 24 and connected to the rigid primary portions 22 and 24 by way of flexible interconnecting portions 50, 52, 54, 56, respectively. The rigid secondary portions 42, 44, 46, 48 provide for dual-sided interconnections between the backplane contacts 40 and the rigid secondary portions 42, 44, 46, 48 as best shown in FIG. 2. Such a configuration provides for generous interconnect spacing for the various connections to the backplane contacts 40. For example, exemplary spacing between contacts in a configuration, as discussed above, for 472 backplane contacts 40 is 0.071 inches center to center between contacts.

The flexible interconnecting portions 50, 52, 54, and 56, are contiguous to the rigid primary portions 22, 24 and the rigid secondary portions 42, 44, 46, and 48 and provide a continuous electrical circuit path between the components 26–37 and the backplane contacts 40. The flexible interconnected portions 50, 52, 54, and 56 may be formed with an offset relative to the rigid secondary portions 42, 44, 46, and 48 and the primary rigid portions 22, 24 as best shown in FIG. 2.

As best shown in FIG. 2, the backplane contacts 40 are carried by an insulator body 56 covered with an EMI shield 58. The insulator body 56 forms a part of the LRM chassis (not shown). The chassis, however, does not form a part of the present invention. The backplane contacts 40 may be configured to form four insertion bays to correspond with the rigid secondary portions 42, 44, 46, and 48. Each insertion bay is formed with a pair of opposing guides 62, 64 (FIG. 1) formed adjacent opposing ends of each row of backplane contacts 40 forming the insertion bay. The guides 62, 64 (FIG. 1) are formed with slots for receiving the rigid secondary portions 42, 44, 46, and 48 and aligning the contact pad 60 on the rigid secondary portions 42, 44, 46, and 48 relative to the backplane contacts 40.

As mentioned above, the rigid secondary portions 42, 44, 46, and 48 are configured for dual-sided connections with the backplane contacts 40. Thus, as best shown in FIG. 2, the backplane contacts 40 are formed in rows. More specifically, four pairs of rows of backplane contacts 40 are formed. Each pair of rows of backplane contacts 40 forms an insertion bay as best shown in FIG. 1 for receiving a dual-sided, rigid secondary portions 42, 44, 46, and 48. The rigid secondary portions 42 and 44 are provided with a plurality of contact pads, generally identified with the reference numeral 60, for enabling electrical interconnection with the backplane contacts 40.

The backplane contacts 40 may be formed with a bend at the upper end, with the ends diverging outwardly as shown in FIG. 2. Such a configuration for the backplane contacts 40 provides good electrical contact between the backplane contacts 40 and the contact pads 60 on the rigid secondary portions 42, 44, 46, and 48. The backplane contacts 40 may be soldered to the contact pads 60 for good electrical connection to the backplane contacts 40.

The use of the flexible interconnecting portions 50, 52, 54 and 56 provides compensation for thermal, as well as vibrational, stress. The use of the flexible interconnecting portions 50, 52, 54 and 56 also provides compensation for differences of the tolerances in the locations of the different components forming the connector system. FIG. 2 illustrates an embodiment in which a single flexible interconnecting portion 50, 52, 54 and 56 is connected to a single rigid secondary portion 42, 44, 46 and 48. FIG. 3 illustrates an alternate embodiment in which a pair of flexible interconnecting portions 70, 72 are connected to each of the secondary portions 42, 44, 46 and 48. The configuration of FIG. 3 can eliminate the need for vias on the rigid secondary portions 42, 44, 46 and 48.

FIGS. 4 through 6 illustrate an alternate embodiment of the LRM illustrated and described above which includes four mini-modules or quarter modules. The quarter modules are virtually the same as the mini-modules 19 and 21 discussed above and illustrated in FIG. 1 and can be configured as illustrated in FIGS. 2 and 3.

The LRM having four quarter modules is generally identified with the reference numeral 100 and includes four quarter modules 102, 104, 106 and 108 (FIGS. 2 and 4 through 6). The quarter modules 102, 104, 106 and 108 are separated by a frame 110 (FIG. 6) which separates the quarter modules 102 and 104 from the quarter modules 106 and 108.

As best shown in FIG. 6, the quarter boards 102, 104, 106 and 108 and the frame 110 are assembled together by way of pair of spaced apart core plates 114 and 116. Each core plate 114 and 116 is formed to length to accommodate two quarter modules 102, 104, 106 and 108. Two quarter modules 102 and 104 are assembled to one side of the frame 110 while the remaining two quarter modules 106 and 108 are assembled to the opposing side of the frame 110.

The frame 110 is provided with a plurality of apertures 113. The apertures 113 are adapted to be aligned with corresponding apertures 118 formed in the core plates 114 and 116 to enable the quarter modules 102, 104, 106 and 108 to be assembled to the frame 110 with suitable fasteners 112. The core plates 114 and 116 are provided with additional apertures 120 which, in turn, allow a pair of covers 122 and 124 (FIG. 5) to be secured to the frame 110 and the core plates 114 and 116 with suitable fasteners 126 to form an assembly in accordance with the present invention.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A line replacement module (LRM) for carrying a plurality of electronic components aboard an aircraft, the LRM adapted to be interconnected to a plurality of backplane contacts forming a serial data bus, the LRM comprising:

a plurality of mini-modules, each mini-module including:

a rigid primary printed circuit board (PCB) for carrying an electronic circuit;

a rigid secondary PCB formed with dual sided contacts;

a flexible interconnection portion, said flexible interconnecting portion configured to provide continuous electrical contact between secondary PCB and said electronic circuit; and a carrier for carrying said plurality of mini-modules forming an LRM, said LRM configured to have a predetermined form factor.

2. The connector system as recited in claim 1, wherein each of said secondary portions is provided with a plurality of contact pads for enabling said backplane contacts to be soldered thereto.

3. The connector system as recited in claim 1, wherein said secondary portions are disposed adjacent one end of said primary portions and generally parallel thereto.

4. The connector system as recited in claim 3, wherein said secondary portions are offset from said primary portions.

5. The connector system as recited in claim 4, wherein said flexible interconnecting portions are flexible and formed with an offset to enable interconnection between said rigid primary portions and said rigid secondary portions.

6. A mini-module for a line replacement module (LRM) for an aircraft, the mini-module comprising:

a rigid primary printed circuit board (PCB) for carrying predetermined circuitry adapted to be connected to a predetermined data bus;

a rigid secondary PCB provided with a plurality of electrical contacts, configured for dual-sided connection to a plurality of contacts forming a data bus; and a flexible interconnecting portion electrically interconnected between said rigid secondary PCB and said rigid primary PCB, said interconnecting portion configured to provide a continuous electrical circuit between said predetermined circuitry on said rigid primary PCB and said rigid secondary PCB, said rigid primary PCB, rigid secondary PCB and said interconnecting portion configured to be received in a carrier having a predetermined form factor.

7. The LRM as recited in claim 6, wherein said primary PCB portion is rigid.

8. The LRM as recited in claim 7, wherein said secondary PCB portion is formed to be generally parallel to said primary PCB portion but offset therefrom.

9. The LRM as recited in claim 8, wherein said secondary PCB portion is rigid.

10. The LRM as recited in claim 9, wherein said interconnecting portion is flexible.

11. The LRM as recited in claim 1, wherein said plurality is two.

12. The LRM as recited in claim 1, wherein said plurality is four.

* * * * *